United States Patent [19]

George

[11] Patent Number: 5,622,400
[45] Date of Patent: Apr. 22, 1997

[54] APPARATUS AND METHOD FOR HANDLING SEMICONDUCTOR WAFERS

[75] Inventor: Gregory George, Colchester, Vt.

[73] Assignee: Karl Suss America, Inc., Waterbury Center, Vt.

[21] Appl. No.: 487,434

[22] Filed: Jun. 7, 1995

[51] Int. Cl.[6] .............................. B25J 15/06; B65H 5/08
[52] U.S. Cl. ...................... 294/64.1; 414/938; 414/941
[58] Field of Search .................................. 294/1.1, 64.1, 294/64.3; 29/743; 269/20, 21; 271/90, 94, 98; 279/3; 414/737, 752, 795.5, 797, 937, 938, 941; 901/40

[56] References Cited

U.S. PATENT DOCUMENTS

| | | | |
|---|---|---|---|
| 2,905,768 | 9/1959 | Cronquist | 294/64.3 X |
| 3,466,079 | 9/1969 | Mammel | 294/64.3 |
| 4,775,281 | 10/1988 | Prentakis | 444/938 X |
| 4,858,975 | 8/1989 | Ogawa | 294/64.1 |
| 4,983,093 | 1/1991 | Foulke et al. | 294/64.1 X |
| 5,077,888 | 1/1992 | Tokisue et al. | 294/64.3 X |
| 5,174,021 | 12/1992 | L'Esperance | 294/64.1 X |

*Primary Examiner*—Johnny D. Cherry
*Attorney, Agent, or Firm*—Martin D. Wittstein

[57] ABSTRACT

Disclosed is an apparatus and method for modifying standard semiconductor wafer tranfer apparatus and method to permit the standard semiconductor wafer transfer apparatus and method to function with wafers that are extremely thin and flexible and are warped sufficiently out of planar configuration that it is impossible to establish a sufficient vacuum between the lower surface of the wafer and the upper surface of the transfer instrumentality. A positive gaseous medium pressure is applied to the upper surface of the wafer around the periphery thereof to cause those areas that are flexed upwardly to flex downwardly and contact the upper surface of the transfer instrumentality so that a sufficient vacuum can be established between the lower surface of the wafer and the upper surface of the transfer instrumentality to cause the wafer to be firmly secured to the transfer instrumentality to be transferred thereby from one location to another.

7 Claims, 2 Drawing Sheets

APPARATUS AND METHOD FOR HANDLING SEMICONDUCTOR WAFERS

BACKGROUND OF THE INVENTION

The present invention relates generally to the field of semiconductor wafers utilized in the manufacture and testing of electronic components such as integrated circuit chips, and more particularly to the process of transferring very thin semiconductor wafers from a one functional component to another in the overall manufacturing and testing process.

Semiconductor wafers have long been well known in the electronics industry in that they form a fundamental element in the manufacture of integrated circuit chips for use in a large variety of control devices for electronic products. Typically, semiconductor wafers are formed of silicon material and are normally about four to eight inches in diameter and about 500 microns (or about 0.5 ml) in thickness. A plurality of suitable circuit patterns, perhaps as many as 500, are placed on the wafer by well known photoetching technology, after which the wafers are cut so that each pattern forms an individual integrated circuit.

In order to ensure the quality of the finished integrated circuits, they must be individually tested with suitable probe and test equipment which applies electrical impulses to selected portions of the circuit and measures the quality of the outgoing signal against predetermined standards to make sure that each integrated circuit meets the appropriate manufacturing specifications. Due to the physical nature of the semiconductor wafer, it is highly desirable to test each individual pattern before the wafer is cut to separate all of the patterns into individual integrated circuits. One reason for this is that it is very difficult to physically handle the individual integrated circuits once they are separated from the wafer because of the fragile nature of the wafer material. Another is that it is far more economical to perform the probing and testing functions while the hundreds of integrated circuit patterns are still physically connected together in the four to eight inch diameter wafer form rather than after they are separated, when they are merely a fraction of an inch across.

In a typical integrated circuit manufacturing operation, the completed wafers with the integrated circuit patterns etched thereon, are placed in a storage and transfer cassette or magazine, which typically is a container of sufficient size to hold about 16 wafers in vertically spaced relationship, therefore making it manually transportable from one place to another. It will be apparent that the integrated circuit patterns are extremely delicate and cannot be subjected to any form of rough handling, including touching by human hands. Accordingly, the wafers are handled almost entirely robotic machines which move them from one manufacturing component to another, or from one manufacturing component to a storage and transfer magazine and vice versa.

A typical form of robotic wafer handling transfer mechanism consists of a transfer device having an arm portion connected to the robotic machine which is capable of moving the arm in any one or more of a variety of directions which may include forward and backward, side to side, up and down and in rotation about a vertical axis; in other words, the arm can be moved linearly in an X-Y-Z motion, as well as rotary motion. A wafer supporting hand portion is attached to the arm portion and typically has either straight or curved fingers, which are provided with suitable apertures through which a vacuum can be applied to the under side of the wafer through suitable conduits interconnected between the apertures and a vacuum applying device. Thus, to move a wafer either into or out of a magazine or to or from a manufacturing machine, the transfer arm is moved by the robotic machine so that the hand portion is positioned directly under the wafer with the vacuum apertures in contact with the lower surface of the wafer. The vacuum applying device is activated to apply a vacuum to the apertures so that the wafer is firmly secured to the upper surface of the hand portion and can then be moved from one place to another under the control of the robotic machine.

Recent advancements in the utility of certain forms of integrated circuit chips have resulted in the need for semiconductor wafers that are far thinner than those heretofore used in electronic control components. Rather than the customary 500 micron thickness of former semiconductor wafers, the wafers manufactured for the new utilities have a thickness in the order of 150 microns (0.15 ml. thick). It was discovered, however, that due to certain characteristics of the wafer material, they became warped to one degree or another during the manufacturing process. An appearance analogy can be made between the wafer and a potato chip, in that both are very thin and warped to one degree or another.

The obvious result of the warping characteristic of the new wafer is that when the hand portion of the transfer device is placed under the wafer, some of the apertures will not be in contact with the lower surface of the wafer and consequently a vacuum cannot be established to secure the wafer to the transfer hand. Thus, the standard apparatus for transferring semiconductor wafers from one manufacturing component to another, or from one manufacturing component to a storage and transfer magazine or vice versa is completely useless for this type of wafer.

BRIEF SUMMARY OF THE INVENTION

The present invention is directed toward solving the foregoing problem by providing an apparatus and method that permits standard wafer transfer apparatus to be utilized with the new extremely thin wafers with the same degree of effectiveness that it has with the thicker wafers.

It was recognized that the same characteristics of the material of the wafer that made it warp during the manufacturing process also resulted in the wafer being highly flexible and easy to bend. It was then discovered that the wafer could be made to lie flat on the under surface of the transfer hand by applying a positive gaseous medium pressure to the upper surface of the wafer generally around the periphery thereof over the vacuum apertures formed in the upper surface of the transfer hand. The positive pressure of the gaseous medium caused the warped wafer to lie perfectly flat on the transfer hand so that the lower surface of the wafer contacted all of the vacuum apertures in the transfer hand, thereby permitting a vacuum to be established that was sufficient to firmly secure the wafer to the transfer hand.

With the foregoing in mind, the principles of the present invention, in its broader aspects, are embodied in an apparatus for transferring thin semiconductor wafers from one location to another, and includes means for supporting a wafer, a transfer instrumentality adapted to be placed beneath the wafer, the transfer instrumentality including a wafer supporting portion and means for applying a vacuum to the upper surface of the wafer supporting portion of the transfer instrumentality to firmly secure the lower surface of the wafer to the upper surface of the wafer supporting portion of the transfer instrumentality, and wherein the wafer is extremely thin and flexible and is warped sufficiently out of planar configuration so that it is impossible to establish a vacuum between the upper surface of the wafer supporting portion of the transfer instrumentality and the lower surface of the wafer sufficient to secure the lower surface of the wafer to the upper surface of the wafer supporting portion of the transfer instrumentality. In this environment, the invention is the improvement comprising means for applying a positive gaseous medium pressure to the upper surface of the wafer while the wafer is supported by the wafer supporting portion of the transfer instrumentality to cause the wafer to flex downwardly in those areas where it is flexed upwardly sufficiently far to prevent the vacuum from being established between the upper surface of the wafer supporting portion of the transfer instrumentality and the lower surface of the wafer, thereby permitting a sufficient vacuum to be established between the lower surface of the wafer and the upper surface of the wafer supporting portion of the transfer instrumentality to cause the wafer to be firmly secured thereto.

In some of its more limited aspects, the invention includes the feature that the vacuum is applied to the upper surface of the supporting instrumentality generally around the periphery thereof so as to be effective on a peripheral portion of the wafer, and the positive gaseous medium pressure is applied generally to the periphery of the wafer in the area directly overlying the location of the supporting instrumentality where the vacuum is applied.

The means for supporting a wafer comprises a magazine having a plurality of individual wafer supporting means constructed and arranged to support a plurality of wafers in a vertically stacked configuration, and the magazine has at least a partially open top to expose the upper surface of the uppermost wafer to the gaseous medium.

Further, the means for applying the positive gaseous medium pressure includes control means for controlling the time and duration of the application of the positive gaseous medium pressure to the upper surface of the wafer only when the wafer is being supported by the wafer supporting portion of the transfer instrumentality, thereby preventing the positive gaseous medium from being applied to an unsupported wafer. The control means preferably comprises a flow switch connected to the means for applying a vacuum to the wafer supporting portion of the transfer instrumentality, the flow switch having means for closing an electric switch when the flow switch detects an absence of air moving therethrough, and valve means connected to the means for applying the positive gaseous medium pressure, the valve means including a solenoid normally maintaining the valve means closed and operable to open the valve means when the flow switch detects an absence of air moving therethrough and closes the electric circuit.

The invention also includes a method of transferring thin semiconductor wafers from one location to another by placing a wafer supporting portion of a transfer instrumentality beneath a wafer and applying a vacuum to the upper surface of the wafer supporting portion of the transfer instrumentality to firmly secure the lower surface of the wafer to the under surface of the wafer supporting portion of the transfer instrumentality, and wherein the wafer is extremely thin and flexible and is warped sufficiently out of planar configuration so that it is impossible to establish a vacum sufficient to secure the lower surface of the wafer to the upper surface of the wafer supporting portion of the transfer instrumentality. In this environment, the invention is the improvement comprising applying a positive gaseous medium pressure to the upper surface of the wafer while the wafer is being supported by the wafer supporting portion of the transfer instrumentality to cause the wafer to flex downwardly in those areas where it is flexed upwardly sufficiently far to prevent the vacuum from being established between the upper surface of the wafer supporting portion of the transfer instrumentality and the lower surface of the wafer, thereby enabling a sufficient vacuum between the lower surface of the wafer and the upper surface of the wafer supporting portion of the transfer instrumentality to cause the wafer to be firmly secured thereto.

Having briefly described the general nature of the present invention, it is a principal object thereof to provide an apparatus and method for causing very thin semiconductor wafers that are warped out of planar configuration sufficiently far to prevent a vacuum from being established between the upper surface of a wafer supporting portion of a transfer instrumentality and the lower surface of the wafer thereby preventing an effective vacuum from being established between the lower surface of the wafer and the upper surface of the wafer supporting portion of the transfer instrumentality.

It is another object of the present invention to provide an apparatus and method that accomplishes the foregoing objective in a manner that facilitates the continued use of conventional wafer transfer apparatus with such very thin and warped wafers which is impossible without the advent of the present invention.

It is yet another object of the present invention to provide an apparatus and method that accomplishes the foregoing objectives by providing a positive gaseous medium pressure on the upper surface of the wafer while it is being supported by the wafer supporting portion of the transfer instrumentality to flex the wafer downwardly in those areas where it is flexed upwardly sufficiently far to prevent the aforementioned vacuum from being established.

It is still another object of the present invention to provide an apparatus and method in which the positive gaseous medium pressure is applied substantially around the periphery of the wafer in the area generally overlying the location of the wafer supporting portion of the transfer instrumentality where the vacuum is applied.

It is yet another object of the present invention to provide an apparatus and method in which the time and duration of the application of the positive gaseous medium pressure are controlled so that the pressure is applied only when the wafer is being supported by the wafer supporting portion of the transfer instrumentality.

These and other objects, features and advantages of the present invention will be more fully appreciated from a consideration of the following detailed description of a presently preferred embodiment of the present invention when considered in conjunction with the accompanying drawings, in which only such structure as is necessary for a clear and full understanding of the invention is included.

DETAILED DESCRIPTION OF THE INVENTION

Figure 1:
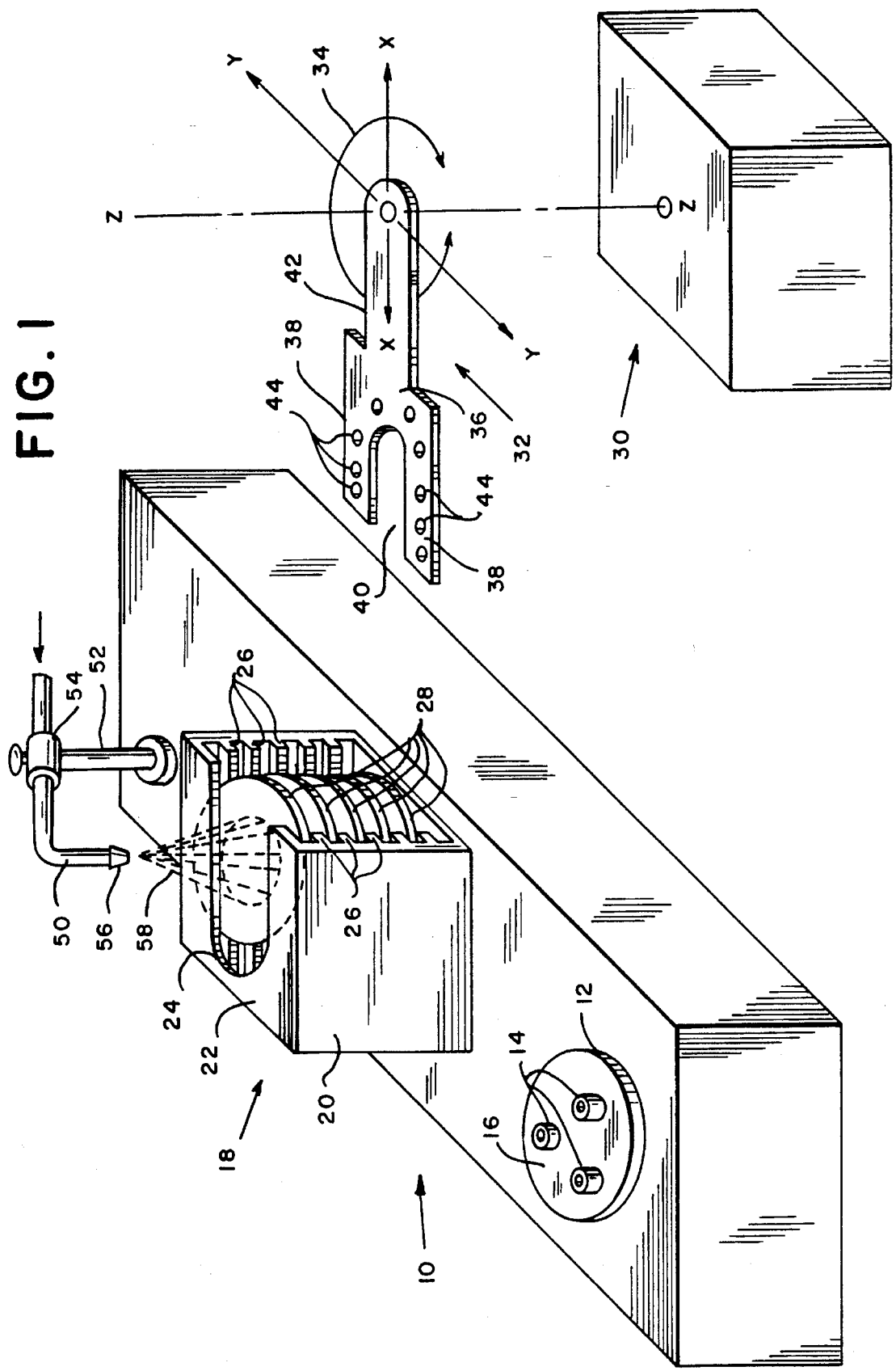
FIG. 1 is a schematic view of a representative apparatus arrangement in which the principles of the present invention can be embodied, illustrating a probing machine, a robotic transfer machine, and a wafer magazine incorporating the gaseous medium positive pressure mechanism of the present invention.

Referring now to the drawings, and particular to FIG. 1 thereof, the principles of the present invention are embodied in an apparatus and method as hereinafter described, in which the reference number 10 generally designates a representative machine for performing a particular manufacturing or testing procedure on a wafer. In the illustration shown, the machine 10 is a probing machine in which a pair of needle-like probes are brought into contact with selected portions of the each of the circuits etched onto the wafer. To accomplish this, the probing machine 10 is provided with a wafer chuck 12 which is suitably mounted for longitudinal and lateral movement by any suitable means such as motorized lead screws connected to the chuck 12 to move it in the desired direction in response to commands from a suitable control apparatus. Other drive means may be employed.

The purpose of the chuck 12 is to hold a wafer in a desired position so that the probes can be brought into contact with the selected portions of the individual circuits. To accomplish this, the chuck is provided with a suitable wafer holding means, such as the three pins 14, which can be raised and lowered relative to the upper surface 16 of the chuck 12. The pins are hollow, and suitable means are provided for applying a vacuum to the pins to firmly secure a wafer to the pins when the vacuum is applied. As will be further clarified hereinbelow, when a wafer is placed on the pins 14 and the vacuum is applied thereto, the pins are then lowered to bring the wafer into supporting contact with the upper surface 16 of the chuck 12.

A wafer storage and transfer magazine, indicated generally the reference numeral 18, is suitably positioned on the probing machine 10 so as to be conveniently adjacent to the chuck 12. The wafer magazine is constructed generally as a rectangular box having closed side and rear walls 20, a top wall 22 having an elongate opening 24 formed therein, and a plurality of elongate runners 26 extending along the inner surfaces of the side walls 20 which form vertically spaced apart supports for the wafers 28.

The reference numeral 30 generally designates a representative robotic transfer machine, of which a large variety are well known in the art. The machine 30 is typically of a relatively simple design and includes suitable mechanism for moving a wafer transfer instrumentality or device, generally designated by the numeral 32, in any one or more different directions as may be desired. Thus, as is schematically represented, the machine 30 may be provided with a plurality of motorized chain drives which are connected to suitable linkage devices to move the wafer transfer device 32 in opposite lateral and longitudinal directions, as indicated by the X—X and Y—Y lines, up and down along the Z—Z line, and also in an arcuate direction about a vertical axis, as indicated by the arrow 34 surrounding the Z—Z line.

The wafer transfer device 32 is typically constructed to have a wafer supporting hand portion 36 which is bifurcated to provide a pair of wafer supporting fingers 38 which surround a central opening 40. Alternatively, the fingers could be made arcuate so as to conform to the circular configuration of the wafers 28. The supporting hand portion 36 is formed integrally with an arm portion 42 by which the hand portion 36 is attached to the aforementioned linkage mechanism of the robotic machine 30. The arm portion 42 and the wafer supporting hand portion 36 are provided with suitable internal conduits so that a vacuum can be applied to the apertures 44 formed on the upper surface of the wafer supporting fingers 38, which serves to firmly secure a wafer 28 thereto in a manner more fully described below.

In the apparatus arrangement as thus far described, a typical and representative operation may be to transfer a wafer 28 from the magazine 18 to the chuck 12 of the probing machine 10 in order to perform a probing operation on the individual integrated circuits positioned on the wafer. Thus, robotic machine 30 is operated in such a manner that the wafer transfer device 32 is moved in the appropriate X, Y, Z and rotary directions so that the wafer transfer device 32 moves laterally in the direction of the line X—X to cause the support fingers 38 to enter the front face of the magazine 18 beneath one of the wafers 28. The transfer device 32 is moved slightly upwardly so as to bring the upper surface of the fingers 38 into contact with the lower surface of the uppermost wafer 28, and a vacuum is applied to the apertures 44 by any suitable control mechanism so as to firmly secure the lower surface of the wafer to the upper surface of the fingers 38. The robotic machine 30 now operates appropriately to withdraw the wafer 28 from the magazine 18 and deposit it on the vacuum pins 14 of the chuck 12. When the wafer 28 is resting on and firmly secured to the pins 1 due to the vacuum applied thereto, the vacuum applied to the apertures 44 on the fingers 38 is then removed so that the transfer hand 36 can be withdrawn from the probing machine 10, after which the vacuum pins 1 are lowered by the mechanism above described until the wafer 28 is supported by the upper surface 16 of the chuck 12. It should be understood that a similar but reverse sequence of operations is carried out to remove the wafer 28 from the chuck 12 and to place a wafer 28 back into the magazine 18.

It should now be appreciated that the foregoing sequence of operations can be very satisfactorily carried out by the apparatus thus far described with a wafer having sufficient strength and rigidity of material that it can be formed to have a perfectly flat or planar lower surface which will remain in that condition throughout the manufacturing operation, so that when the lower surface of the wafer 28 contacts the upper surface of the fingers 38, all of the vacuum apertures 4 of the fingers are covered by the wafer 28 and a sufficient vacuum is applied to the wafer 28 to secure it firmly to the transfer hand 36.

The situation is entirely different, however, when attempting to use the apparatus thus far described to transfer a very thin wafer that has been warped during the manufacturing process and therefore is sufficiently out of planar configuration to prevent a vacuum from being established between the lower surface of the wafer and the upper surface of the supporting fingers 38 of the transfer hand 36. It has been found that the geometry of the warped portions of the wafer can be either convex or concave, often resembling a potato chip, with respect to the upper surface of the fingers 38, and the magnitude of the warp is entirely unpredictable. Thus, if even one aperture 44 is not fully covered by the lower surface of the wafer 28, it becomes impossible to establish a sufficiently strong vacuum on all of the apertures 44 to firmly secure the wafer to the fingers 38. And more often than not, the warp configuration and magnitude of the wafer is such that more than one aperture is uncovered.

The present overcomes this impediment to the use of conventional wafer transfer apparatus with very thin wafers by providing an improvement to the conventional apparatus in the form of a means for applying a positive gaseous medium pressure to the upper surface of the wafer to cause the wafer to flex downwardly in those areas where it is flexed upwardly sufficiently far to prevent the aforementioned vacuum from being established between the upper surface of the transfer hand 36 and the lower surface of the wafer 28, thereby permitting a sufficient vacuum to be established between the lower surface of the wafer 28 and the upper surface of the transfer hand 36 to cause the wafer to be firmly secured thereto. Thus, it will be seen that a suitable conduit 50 is positioned over the wafer magazine 18 and is held in place by a suitable stand 52 and bracket 54 suitably supported by the probing machine 10. The lower end of the conduit 50 is provided with a nozzle 56 designed to provide a generally conically shaped column of the gaseous medium, indicated by the dotted lines 58. It will be noted that the recess 24 in the top wall 22 of the magazine 18 is sufficiently wide to permit the column of gaseous medium to impinge on a major portion of the upper surface area of the uppermost wafer 28 in the magazine 18, and to permit the same condition to exist with each succeeding lower wafer in the stack.

In actual practice, the nozzle is oriented generally in the range of from 2 to 10 inches above the location from which a wafer is being removed or on which it is being deposited, i.e., a storage magazine, a chuck of an operational machine, etc. The dispersion angle from the nozzle is approximately 30°.

Figure 2:
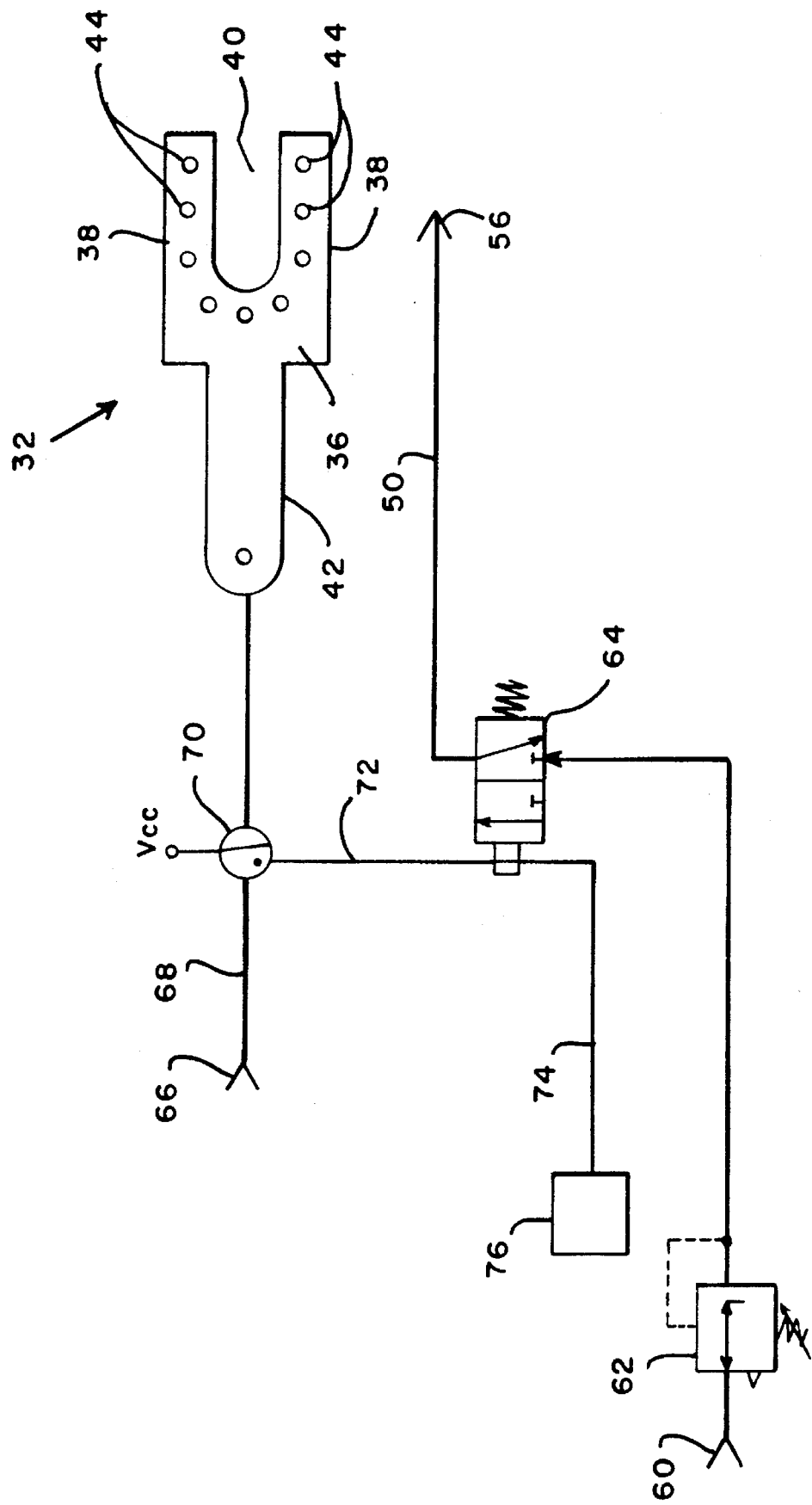
FIG. 2 is a schematic diagram of a typical control system for the gaseous medium positive pressure mechanism.

FIG. 2 is a schematic diagram of a typical control system for the apparatus of the present invention. The gaseous medium, which may be any suitable form of inert gas which will not react with the delicate integrated circuit patterns on the wafer, is stored in a suitable supply 60 and is fed through a combination flow and pressure regulator 62 which feeds the gas at 2.5 CFM at a pressure of 15 PSI. The gas then flows through a normally closed solenoid controlled valve 64 and from there through the conduit 50 to the nozzle 56.

The numeral 66 represents any suitable apparatus for creating a vacuum in a vacuum line 68 which communicates with a vacuum flow switch 70, and then communicates with the wafer transfer device 32. The flow switch 70 is constructed so that when air is moving freely through the line 68 the flow switch is closed to establish an electric circuit that includes a line 72 which is connected to the solenoid 64 and then through another line 74 to an electrical control device 76 which provides a control signal for the solenoid valve 64. When a vacuum is detected, the flow switch 70 opens to break the aforementioned circuit.

From the foregoing, the operation of the entire apparatus can now be understood. Assuming that an operator has placed a magazine 18 containing a stack of wafers 28 adjacent the operating station of the probing machine 10, as represented by the chuck 12, and it is desired to place a wafer 28 onto the chuck 12, the robotic machine 30 is actuated to cause the fingers 38 of the wafer transfer device 32 to enter the magazine 18 in the space between the uppermost and next lower wafers 28, and to cause the upper surface of the fingers 38 to contact the lower surface of the uppermost wafer 28. During this movement of the wafer transfer device 32, the vacuum source 66 is in operation to cause a flow of air through the apertures 44 in the fingers 38 and through the flow switch 70, thereby closing the circuit through the line 72 to the solenoid valve 64. At this time, however, the control device 76 maintains the circuit to the solenoid valve 64 in an open condition so that the solenoid valve 64 remains closed, thereby preventing gas from blowing on a wafer 28 that is not properly supported by the upper surfaces of the fingers 38.

When the transfer hand 36 is fully inserted into the magazine 18 and is supporting the wafer 28, the control device 76 then closes the circuit to the solenoid valve 64 so that a complete circuit is now established through the control device 76, the solenoid valve 64 and the flow switch 70 which energizes the solenoid valve 64 to cause it to open and allow gas to exit through the nozzle 56. At this point, at least one, or perhaps some, of the apertures 44 in the fingers 38 remain uncovered due to warped portions of the wafer 28 not lying flat on the fingers 38, thereby effectively preventing a sufficient vacuum from being established in the transfer hand 32 to firmly grip the lower surface of the wafer. However, the positive pressure force of the gas on the upper surface of the wafer 28 causes it to flex downwardly in those areas where it is warped upwardly so as to effectively cover all of the apertures 44 and thereby establish an effective vacuum in the line 68. The flow switch 70 immediately senses this condition and breaks the circuit to the solenoid valve 64, thereby permitting the valve to close so as to stop the flow of gas therethrough. This again prevents the gas from blowing on the next lower wafer which has no support underneath while the transfer device 32 is withdrawing the uppermost wafer 28 from the magazine 18 and transferring it to the work station.

After the wafer 28 has been deposited on the supporting pins 14 of the chuck 12 of the probing machine 10, the vacuum source 66 is deactivated to release the vacuum at the apertures 44 to enable the transfer device 32 to be removed from beneath the wafer 28. The flow of air through the vacuum line 68 does cause the flow switch to close, but this does not complete a circuit to the solenoid valve 64 to cause it to open because the control device 76 maintains the circuit to the solenoid valve 64 open to prevent the solenoid valve 64 from opening until he wafer supporting fingers 38 of the transfer device 32 are again supporting a wafer 28.

The method of the present invention also involves an improvement to a conventional practice. Thus, the practice heretofore has been to transfer thin semiconductor wafers from one location to another by placing a wafer supporting portion of a transfer instrumentality beneath a wafer and applying a vacuum to the upper surface of the wafer supporting portion of the transfer instrumentality to firmly secure the lower surface of the wafer to the upper surface of the wafer supporting portion of the transfer instrumentality, and then moving the transfer instrumentality from one location to the another. However, in the situation where the wafer is extremely thin and flexible and is warped sufficiently out of planar configuration that it does not contact the vacuum apertures on the upper surface of the wafer supporting portion of the transfer instrumentality, it is impossible to establish a vacuum sufficient to secure the lower surface of the wafer to the upper surface of the wafer supporting portion of the transfer instrumentality.

Thus, to overcome this impediment to the use of the standard transfer instrumentality with such extremely thin wafers, the invention contemplates the improvement of applying a positive gaseous medium pressure to the upper surface of the wafer to cause the wafer to flex downwardly in those areas where it is flexed upwardly sufficiently far to prevent the vacuum from being established between the upper surface of the wafer supporting portion of the transfer instrumentality and the lower surface of the wafer, thereby establishing a sufficient vacuum between the lower surface of the wafer and the upper surface of the wafer supporting portion of the transfer instrumentality to cause the wafer to be firmly secured thereto.

As is the case with the apparatus invention, the method also includes the step of applying the positive gaseous medium pressure substantially to the periphery of the wafer directly over the location of the wafer supporting portion of the transfer instrumentality where the vacuum is applied thereto.

It is to be understood that the present invention is not to be considered as limited to the specific embodiment described above and shown in the accompanying drawings, which is merely illustrative of the best mode presently contemplated for carrying out the invention and which is susceptible to such changes as may be obvious to one skilled in the art, but rather that the invention is intended to cover all such variations, modifications and equivalents thereof as may be deemed to be within the scope of the claims appended hereto.

We claim:

1. In an apparatus for transferring thin semiconductor wafers from one location to another including means for supporting a wafer, a transfer instrumentality adapted to be placed beneath a wafer, said transfer instrumentality including a wafer supporting portion and means for applying a vacuum to the upper surface of said wafer supporting portion of said instrumentality to firmly secure the lower surface of said wafer to the upper surface of said wafer supporting portion of said transfer instrumentality, and wherein said wafer is extremely thin and flexible and is warped sufficiently out of planar configuration so that it is impossible to establish a vacuum between said upper surface of said wafer supporting portion of said transfer instrumentality and said lower surface of said wafer sufficient to secure said lower surface of said wafer to said upper surface of said wafer supporting portion of said transfer instrumentality, the improvement comprising means for applying a positive gaseous medium pressure to the upper surface of said wafer while said wafer is on said wafer supporting portion of said transfer instrumentality to cause said wafer to flex downwardly in those areas where it is flexed upwardly sufficiently far to prevent the vacuum from being established between said upper surface of said wafer supporting portion of said transfer instrumentality and said lower surface of the wafer, thereby permitting a sufficient vacuum to be established between said lower surface of said wafer and said upper surface of said wafer supporting portion of said transfer instrumentality to cause said wafer to be firmly secured thereto.

2. The improvement as set forth in claim 1 wherein said means for applying said vacuum to said upper surface of said wafer supporting portion of said transfer instrumentality is located generally around a substantial portion of the periphery of said wafer supporting portion so as to be effective on a peripheral portion of the wafer, and wherein said means for applying said positive gaseous medium pressure is located above said wafer and applies said positive gaseous medium pressure generally to the periphery of the wafer in the area directly overlying the location of said vacuum applying means on said wafer supporting portion of said transfer instrumentality.

3. The improvement as set forth in claim 2 wherein said means for supporting a wafer comprises a magazine having a plurality of individual wafer supporting means constructed and arranged to support a plurality of wafers in a vertically stacked configuration, said magazine having at least a partially open top to permit said gaseous medium to impinge on said upper surface of the uppermost wafer in said magazine.

4. The improvement as set forth in claim 3 wherein said means for applying said positive gaseous medium pressure to said upper surface of said wafer includes control means for controlling the time and duration of the application of said positive gaseous medium pressure so that said positive gaseous medium pressure is applied to said upper surface of said wafer only when said wafer is being supported by said wafer supporting portion of said transfer instrumentality, thereby preventing said positive gaseous medium from being applied to an unsupported wafer.

5. The improvement as set forth in claim 4 wherein said control means includes

A. a flow switch connected to said means for applying a vacuum to said upper surface of said wafer supporting portion of said transfer instrumentality, the flow switch having means for closing an electric switch when said flow switch detects an absence of air moving therethrough, and B. valve means connected to said means for applying said positive gaseous medium pressure, said valve means including a solenoid normally maintaining said valve means closed and operable to open said valve means when said flow switch detects an absence of air moving therethrough and closes said electric circuit.

6. In a method of transferring thin semiconductor wafers from one location to another by placing a wafer supporting portion of a transfer instrumentality beneath a wafer and applying a vacuum to the upper surface of the wafer supporting portion of the transfer instrumentality to firmly secure the lower surface of the wafer to the upper surface of the wafer supporting portion of the transfer instrumentality, and wherein the wafer is extremely thin and flexible and is warped sufficiently out of planar configuration so that it is impossible to establish a vacuum sufficient to secure the lower surface of the wafer to the upper surface of the wafer supporting portion of the instrumentality, the improvement comprising applying a positive gaseous medium pressure to the upper surface of the wafer while the wafer is being supported by the wafer supporting portion of the transfer instrumentality to cause the wafer to flex downwardly in those areas where it is flexed upwardly sufficiently far to prevent the vacuum from being established between the upper surface of the wafer supporting portion of the transfer instrumentality and the lower surface of the wafer, thereby establishing a sufficient vacuum between the lower surface of the wafer and the upper surface of the wafer supporting portion of the transfer instrumentality to cause the wafer to be firmly secured thereto.

7. The improvement as set forth in claim 6 wherein the vacuum applied to the upper surface of the wafer supporting portion of the transfer instrumentality is located generally around the periphery thereof so as to be effective on a peripheral portion of the wafer, and wherein said positive gaseous medium pressure is applied generally to the periphery of the wafer in the area directly overlying the location of the supporting instrumentality where the vacuum is applied.

* * * * *